United States Patent
Daimon

(10) Patent No.: US 11,973,487 B2
(45) Date of Patent: Apr. 30, 2024

(54) ACOUSTIC WAVE DEVICE AND LADDER FILTER

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 572 days.

(21) Appl. No.: 17/178,300

(22) Filed: Feb. 18, 2021

(65) Prior Publication Data

US 2021/0175872 A1    Jun. 10, 2021

Related U.S. Application Data

(63) Continuation of application No. PCT/JP2019/033536, filed on Aug. 27, 2019.

(30) Foreign Application Priority Data

Aug. 30, 2018    (JP) .................................. 2018-161636

(51) Int. Cl.
*H03H 9/13* (2006.01)
*H03H 9/17* (2006.01)
*H03H 9/56* (2006.01)

(52) U.S. Cl.
CPC .............. *H03H 9/131* (2013.01); *H03H 9/17* (2013.01); *H03H 9/568* (2013.01)

(58) Field of Classification Search
CPC .......... H03H 9/131; H03H 9/17; H03H 9/568; H03H 9/02858; H03H 9/02881; H03H 9/1457; H03H 9/02992; H03H 9/14541; H03H 9/02574

USPC .......................................... 333/133, 193–196
See application file for complete search history.

(56) References Cited

U.S. PATENT DOCUMENTS

| 9,698,754 B2 * | 7/2017 | Burak .................... H03H 9/175 |
| 2014/0001919 A1 | 1/2014 | Komatsu et al. |
| 2015/0280689 A1 | 10/2015 | Nakamura et al. |
| 2016/0285430 A1 | 9/2016 | Kikuchi et al. |

(Continued)

FOREIGN PATENT DOCUMENTS

| JP | 2010-263662 A | 11/2010 |
| JP | 2015-188123 A | 10/2015 |
| WO | 2012/127793 A1 | 9/2012 |

(Continued)

OTHER PUBLICATIONS

Official Communication issued in International Patent Application No. PCT/JP2019/033536, dated Oct. 8, 2019.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes an IDT electrode on a piezoelectric body and the IDT electrode includes first and second busbars, and first and second electrode fingers. A first dielectric film extends from a region between tip end portions of the first electrode fingers and the piezoelectric body to a region between the second busbar and the piezoelectric body with a first gap in between. The second electrode fingers are in direct contact with the piezoelectric body at a center of an overlap width, and a permittivity of the first dielectric film is lower than a permittivity of the piezoelectric body.

20 Claims, 11 Drawing Sheets

(56) References Cited

U.S. PATENT DOCUMENTS

2017/0222619 A1   8/2017   Iwamoto et al.

FOREIGN PATENT DOCUMENTS

| WO | 2015/098694 A1 | 7/2015 |
| WO | 2016/084526 A1 | 6/2016 |

* cited by examiner

ACOUSTIC WAVE DEVICE AND LADDER FILTER

CROSS REFERENCE TO RELATED APPLICATIONS

This application claims the benefit of priority to Japanese Patent Application No. 2018-161636 filed on Aug. 30, 2018 and is a Continuation Application of PCT Application No. PCT/JP2019/033536 filed on Aug. 27, 2019. The entire contents of each application are hereby incorporated herein by reference.

BACKGROUND OF THE INVENTION

1. Field of the Invention

The present invention relates to an acoustic wave device and a ladder filter in each of which a dielectric is disposed between a portion of an IDT electrode and a piezoelectric body.

2. Description of the Related Art

For example, Japanese Unexamined Patent Application Publication No. 2010-263662 discloses an acoustic wave device in which an IDT electrode is disposed on a piezoelectric body. The IDT electrode includes a first busbar, a second busbar, a plurality of first electrode fingers connected to the first busbar, and a plurality of second electrode fingers connected to the second busbar. The plurality of first electrode fingers and the plurality of second electrode fingers are interdigitated with each other.

Permittivity of a piezoelectric body is relatively high. Disposing an IDT electrode directly on the piezoelectric body therefore tends to cause capacitance between the tip end of a first electrode finger and a second busbar, and capacitance between the tip end of a second electrode finger and a first busbar of the IDT electrode to increase.

The capacitance described above is connected in parallel to the capacitance generated between the first electrode finger and the second electrode finger. Accordingly, when the capacitance generated between the tip end of the first electrode finger and the second busbar, and between the tip end of second electrode finger and the first busbar increases, overall capacitance of the IDT electrode increases. Thus, when the acoustic wave resonator is configured using an acoustic wave device in which the IDT electrode is directly disposed on the piezoelectric body, the anti-resonant frequency may be close to the resonant frequency and the fractional bandwidth may be narrow.

Further, when the IDT electrode is disposed directly on the piezoelectric body, an electric field due to the piezoelectric body may concentrate between the tip end of the first electrode finger and the second busbar and between the tip end of the second electrode finger and the first busbar of the IDT electrode. This may cause a surge breakdown.

SUMMARY OF THE INVENTION

Preferred embodiments of the present invention provide acoustic wave devices that each have a wide fractional bandwidth and in which surge breakdown of an IDT electrode is reduced or prevented.

An acoustic wave device according to a preferred embodiment of the present invention includes a piezoelectric body and an IDT electrode disposed on the piezoelectric body. The IDT electrode includes a first busbar, a second busbar separate from the first busbar, a plurality of first electrode fingers each of which includes a base end and a tip end and a plurality of second electrode fingers each of which includes a base end and a tip end, the plurality of first electrode fingers and the plurality of second electrode fingers interdigitated with each other. The base ends of the first electrode fingers are connected to the first busbar, the tip ends of the first electrode fingers face the second busbar with a first gap therebetween, the base ends of the second electrode fingers are connected to the second busbar, the tip ends of the second electrode fingers face the first busbar with a second gap therebetween. The acoustic wave device further includes a first dielectric film extending from a region between tip end portions of the first electrode fingers and the piezoelectric body to a region between the second busbar and the piezoelectric body via the first gap. The second electrode fingers are in direct contact with the piezoelectric body at a center of an overlap width, and permittivity of the first dielectric film is lower than permittivity of the piezoelectric body.

With the acoustic wave devices according to preferred embodiments of the present invention, it is possible to provide a wide fractional bandwidth and to reduce or prevent the surge breakdown of the IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that the preferred embodiments described in this description are merely exemplary, and that a partial replacement or a combination of configurations is possible among different preferred embodiments.

Figure 1:
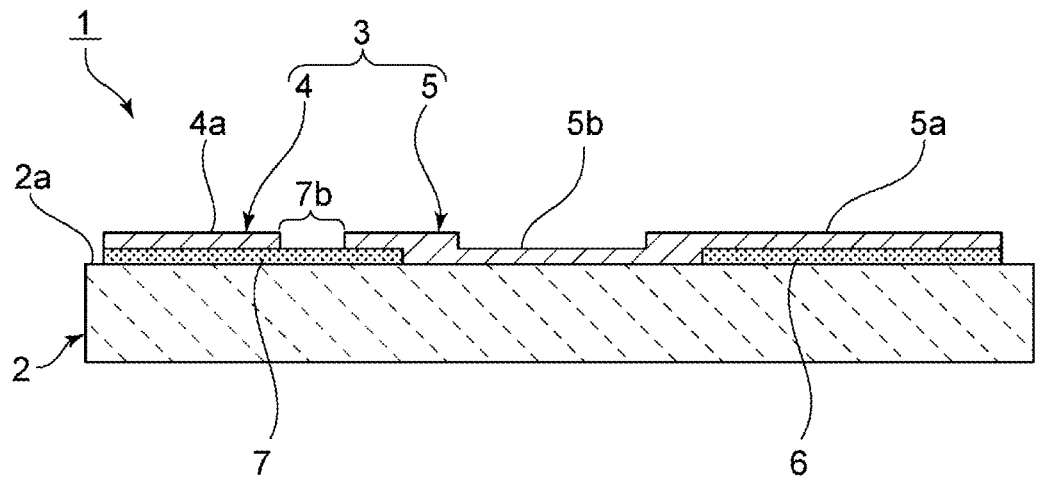
FIG. 1 is a side sectional view of an acoustic wave device according to a first preferred embodiment of the present invention.
Figure 2:
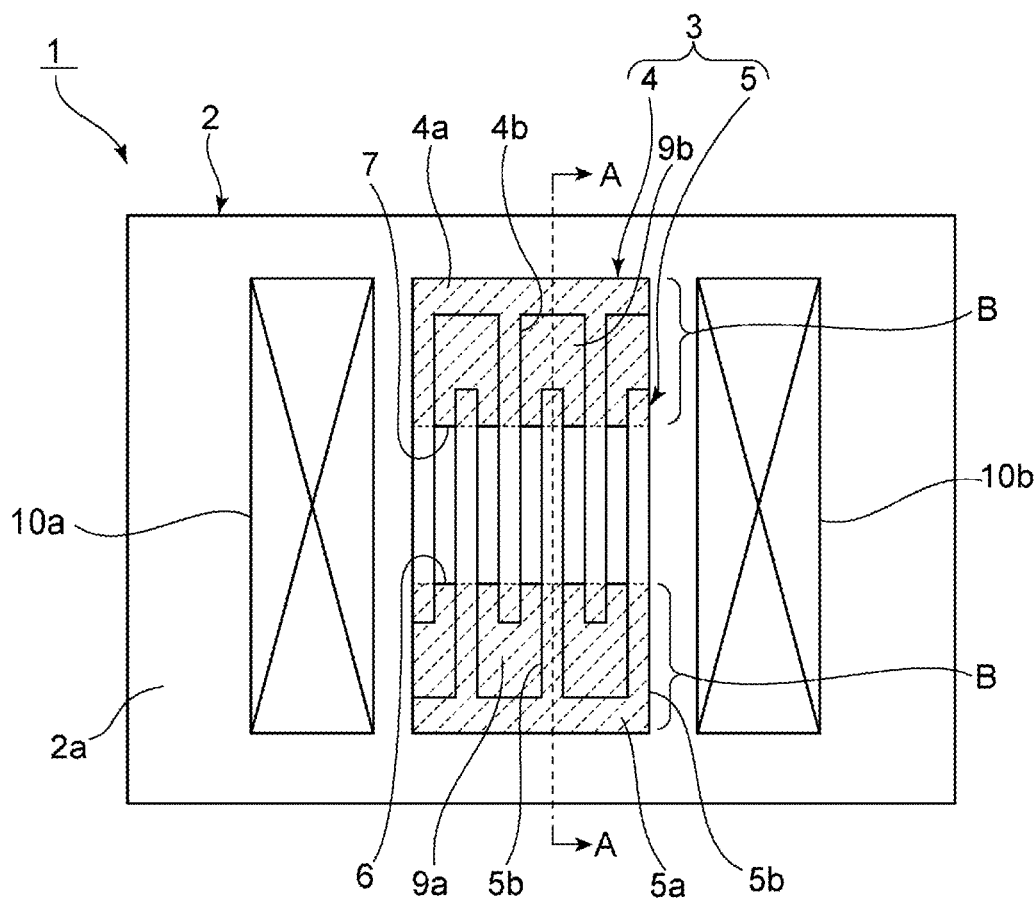
FIG. 2 is a schematic plan view of the acoustic wave device according to the first preferred embodiment of the present invention.

FIG. 1 is a side sectional view of an acoustic wave device according to a first preferred embodiment of the present invention, and FIG. 2 is a schematic plan view of the acoustic wave device of the first preferred embodiment. FIG. 1 is a side sectional view of a portion taken along line A-A in FIG. 2.

An acoustic wave device 1 includes a piezoelectric body 2 and an IDT electrode 3 disposed on the piezoelectric body 2. Reflectors 10a and 10b are disposed on both sides of the IDT electrode 3 along an acoustic wave propagation direction. Thus, a one-port acoustic wave resonator is provided.

The piezoelectric body 2 is preferably made of, for example, lithium tantalate in the present preferred embodiment. Lithium tantalate has a permittivity of about 40. Note that the piezoelectric body 2 is not limited to lithium tantalate, and may be made of another piezoelectric single crystal, such as lithium niobate, or may be made of piezoelectric ceramics, for example. Further, as will be described later, the piezoelectric body 2 is not limited to a material made of a piezoelectric material alone. A piezoelectric body in which a piezoelectric film is layered on a support substrate or other such piezoelectric body may be used.

The IDT electrode 3 and the reflectors 10a and 10b are made of any suitable metals or alloys. In addition, the IDT electrode 3 and the reflectors 10a and 10b may be made of a layered metallic film in which a plurality of metallic films are layered.

The reflectors 10a and 10b are each illustrated by a symbol of rectangular frame with X inside in FIG. 2. More specifically, the reflectors 10a and 10b are grating reflectors. That is, the plurality of electrode fingers are short-circuited at both ends in the reflectors 10a and 10b.

The IDT electrode 3 includes a first comb-shaped electrode 4 and a second comb-shaped electrode 5. The first comb-shaped electrode 4 includes a first busbar 4a and a plurality of first electrode fingers 4b including base ends connected to the first busbar 4a. The second comb-shaped electrode 5 includes a second busbar 5a and a plurality of second electrode fingers 5b including base ends connected to the second busbar 5a.

The plurality of first electrode fingers 4b extend toward the second busbar 5a. The tip end of the first electrode finger 4b is separated from the second busbar 5a with a first gap 9a therebetween.

The second electrode finger 5b extends toward the first busbar 4a. The tip end of the second electrode finger 5b is separated from the first busbar 4a with a second gap 9b therebetween.

The plurality of first electrode fingers 4b and the plurality of second electrode fingers 5b are interdigitated with each other. A region in which the plurality of first electrode fingers 4b and the plurality of second electrode fingers 5b overlap each other when viewed in the acoustic wave propagation direction is an overlap region. The dimension of the overlap region along the extending direction of the first electrode finger 4b and the second electrode finger 5b is an overlap width.

Applying an AC electric field between the first electrode finger 4b and second electrode finger 5b causes an acoustic wave to be strongly excited in the overlap region. Accordingly, the excitation intensity of the acoustic wave is strongest at the center or approximate center of the overlap width.

Note that the acoustic wave propagation direction is a direction orthogonal or substantially orthogonal to the direction in which the first electrode finger 4b and the second electrode finger 5b extend, and is a direction parallel or substantially parallel to a first main surface 2a of the piezoelectric body 2.

A first dielectric film 6 and a second dielectric film 7 are disposed on the first main surface 2a of the piezoelectric body 2 in the acoustic wave device 1.

Here, a tip end portion of each of the first electrode finger 4b and the second electrode finger 5b is a region including a tip end and extending from the tip end toward the center of the overlap width, the region being a portion of a tip end portion not extending to the center of the overlap width. The first dielectric film 6 extends from a region between the tip end portion of the first electrode finger 4b and the first main surface 2a of the piezoelectric body 2 to a region between the second busbar 5a and the first main surface 2a of the piezoelectric body 2 via the first gap 9a. That is, the first dielectric film 6 is disposed in the region indicated by B in FIG. 2.

Note that the regions where the first and second dielectric films are disposed are denoted by hatching of dashed lines in FIG. 2, and in, for example, FIG. 6, FIG. 7, and FIG. 10, which will be described below. Although the first dielectric film and the second dielectric film 7 are located under the IDT electrode 3, the regions where the first dielectric film 6 and the second dielectric film 7 are disposed are illustrated by hatching of dashed lines to be easily identified.

The second dielectric film 7 extends from a region between the tip end portion of the second electrode finger 5b and the first main surface 2a of the piezoelectric body 2 to a region between the first busbar 4a and the first main surface 2a of the piezoelectric body 2 via the second gap 9b.

Although not particularly limited, the first dielectric film 6 is disposed over the entire or substantially the entire length of the second busbar 5a in the acoustic wave propagation direction in the present preferred embodiment. The second dielectric film 7 is disposed over the entire or substantially the entire length of the first busbar 4a in the acoustic wave propagation direction.

That is, the first dielectric film 6 and the second dielectric film 7 extend over the entire or substantially the entire length of the IDT electrode 3 in the acoustic wave propagation direction.

The first dielectric film 6 and the second dielectric film 7 are made of a dielectric material whose permittivity is lower than the permittivity of the piezoelectric body 2. The first dielectric film 6 and the second dielectric film 7 are preferably made of, for example, tantalum pentoxide in the present preferred embodiment. Tantalum pentoxide has the permittivity of about 8. Note that the material of the dielectric is not particularly limited as long as the permittivity of the material is lower than the permittivity of the piezoelectric body 2. For example, dielectrics such as silicon oxide, silicon oxynitride, aluminum oxide, silicon carbide, silicon nitride, or aluminum nitride may be used. Silicon oxide has the permittivity of about 4.

The first dielectric film 6 and the second dielectric film 7 are disposed in the acoustic wave device 1. In addition, the first electrode finger 4b and the second electrode finger 5b are in direct contact with the piezoelectric body 2 in the central region of the overlap width of the first electrode finger 4b and the second electrode finger 5b. The first dielectric film 6 and the second dielectric film 7 enable the capacitance connected in parallel to be reduced. Accordingly, a fractional bandwidth wider than that in the acoustic wave device described in the above-described prior art is obtained. In addition, since the central region of the overlap width of the first electrode finger 4b and the second electrode finger 5b is in direct contact with the piezoelectric body 2, the excitation intensity of the acoustic wave is able to be sufficiently increased. Thus, the electromechanical coupling coefficient is increased, and thus, the fractional bandwidth may be further widened. The central region of the overlap width may be a region including at least the center of the overlap width in the overlap width direction.

Note that the second dielectric film 7 is not necessarily provided. Providing the first dielectric film 6 enables the fractional bandwidth to be widened and the surge breakdown to be reduced or prevented.

Figure 3:
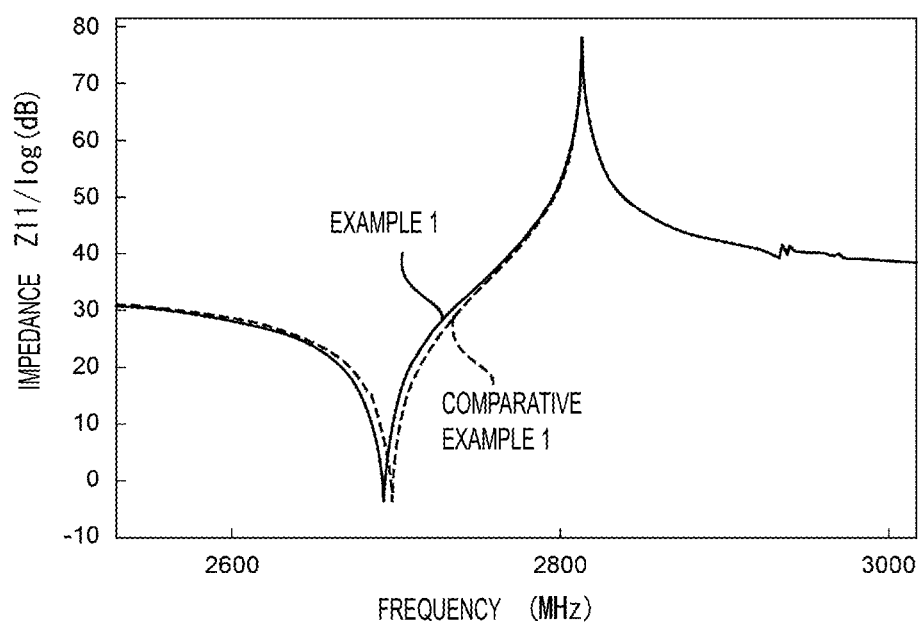
FIG. 3 is a diagram illustrating resonant characteristics of an acoustic wave device of Example 1 according to the first preferred embodiment and an acoustic wave device of Comparative Example 1.

FIG. 3 is a diagram illustrating the resonant characteristics of the acoustic wave device of Example 1 according to the acoustic wave device 1 of the first preferred embodiment and the acoustic wave device of Comparative Example 1. Comparative Example 1 is configured similarly to Example 1 except that the first and second dielectric films are not provided. The design parameters of the acoustic wave device of Example 1 are as follows.

The material of each of the IDT electrode 3, the reflector 10a, and the reflector 10b is a layered film of Ti and Al. The thickness of Ti is about 10 nm and the thickness of Al is about 100 nm, respectively.

The number of pairs of the electrode fingers in the IDT electrode 3 is 150.

The wavelength λ determined by the electrode finger pitch in the IDT electrode 3 is about 2 μm.

The overlap width is about 20 μm.

The dimension of the first gap 9a and the second gap 9b is about 0.3 μm in the direction orthogonal or substantially orthogonal to the propagation direction of the acoustic wave.

The dimension of the first busbar 4a and the second busbar 5a along the propagation direction of the acoustic wave is about 300 μm. The dimension of the first busbar 4a and the second busbar 5a in the direction orthogonal or substantially orthogonal to the propagation direction of the acoustic wave is about 10 μm.

The number of the electrode fingers in each of the reflectors 10a and 10b is 41.

The material of each of the first dielectric film 6 and the second dielectric film 7 is tantalum pentoxide.

The thickness of each of the first dielectric film 6 and the second dielectric film 7 is about 30 nm.

The dimension B of each of the first dielectric film 6 and the second dielectric film 7 is about 11.3 μm in the direction orthogonal or substantially orthogonal to the acoustic wave propagation direction.

Accordingly, the dimension of the region where the tip end portion of the first electrode finger 4b overlaps the first dielectric film 6 along the direction orthogonal or substantially orthogonal to the acoustic wave propagation direction is about 1 μm. Similarly, the dimension of the region where the tip end portion of the second electrode finger 5b overlaps the second dielectric film 7 along the direction orthogonal or substantially orthogonal to the acoustic wave propagation direction is about 1 μm.

As illustrated in FIG. 3, the resonant frequency in the acoustic wave device 1 of Example 1 is lower than that of the acoustic wave device of Comparative Example 1, and thus the fractional bandwidth is widened.

The first dielectric film is disposed in the gap (first gap) between the tip end of the first electrode finger and the second busbar, and the second dielectric film is disposed in the gap (second gap) between the tip end of the second electrode finger and the first busbar in the acoustic wave device 1 of Example 1 unlike the acoustic wave device of Comparative Example 1. With this configuration, the insulation resistance increases between the tip end of the first electrode finger and the second busbar, and between the tip end of the second electrode finger and the first busbar. Thus, the advantageous effect of reducing or preventing the surge breakdown is also obtained.

Figure 4:
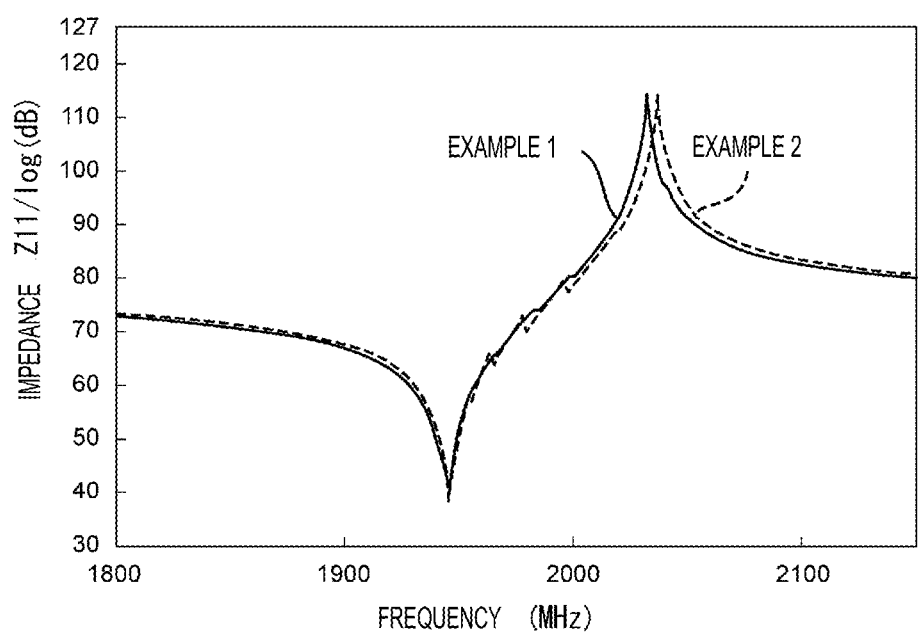
FIG. 4 is a diagram illustrating resonant characteristics of the acoustic wave devices of Example 1 and Example 2.

As described above, the first dielectric film 6 and the second dielectric film 7 may be made of various dielectrics. In FIG. 4, the solid line indicates the resonant characteristics of the acoustic wave device of Example 1, and the dashed line indicates the resonant characteristics of the acoustic wave device of Example 2. Example 2 is configured similarly to Example 1 except that the first dielectric film 6 and the second dielectric film 7 are made of silicon oxide, instead of tantalum pentoxide.

As is apparent in FIG. 4, the anti-resonant frequency is positioned in a higher frequency side in the resonant characteristics of Example 2 indicated by the dashed line compared with the resonant characteristics of Example 1 indicated by the solid line. Accordingly, the fractional bandwidth may be further widened in Example 2.

Since the permittivity of silicon oxide is about 4 and is lower than the permittivity of tantalum pentoxide, the fractional bandwidth of Example 2 is wider than that of Example 1.

However, a plurality of ripples appear in Example 2 in the frequency range between the resonant frequency and the anti-resonant frequency. A transverse mode ripple is considered to be the cause of the above. Accordingly, in a case where the transverse mode ripple needs to be reduced or prevented, Example 1 using tantalum pentoxide is preferable as compared to Example 2.

Figure 5:
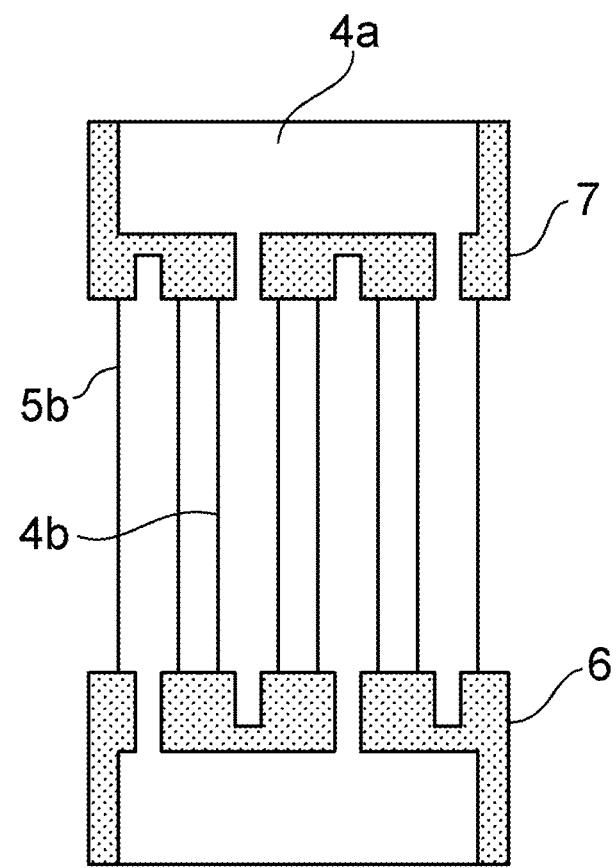
FIG. 5 is a plan view illustrating an IDT electrode of a modification of the acoustic wave device according to the first preferred embodiment of the present invention.

FIG. 5 is a plan view illustrating an IDT electrode of a modification of the acoustic wave device according to the first preferred embodiment. The regions where the first and second dielectric films are disposed are denoted by hatching of dots in FIG. 5. In the first electrode finger 4b and the second electrode finger 5b, the dimension along the acoustic wave propagation direction is defined as the width of the electrode finger. The acoustic wave propagation direction is orthogonal or substantially orthogonal to the direction in which the first electrode finger 4b and the second electrode finger 5b extend. The width of at least the first electrode finger 4b on the first dielectric film 6 and the second dielectric film 7 may be narrower than the width in the remaining portion of the first electrode finger 4b, for example, the width in the central region of the overlap width of the first electrode finger 4b. The width of at least the second electrode finger 5b on the first dielectric film 6 and the second dielectric film 7 may be narrower than the width in the remaining portion of the second electrode finger 5b, for example, the width in the central region of the overlap width of the second electrode finger 5b. In this case, it is possible to more reliably reduce or prevent the surge breakdown. In addition, at this time, the portion where the width of the first electrode finger 4b is narrowed may be extended to a portion of the remaining portion of the first electrode finger 4b that is not on the first dielectric film 6 or the second dielectric film 7. Also, the portion where the width of the second electrode finger 5b is narrowed may be extended to a portion of the remaining portion of the second electrode finger 5b that is not on the first dielectric film 6 or the second dielectric film 7.

Figure 6:
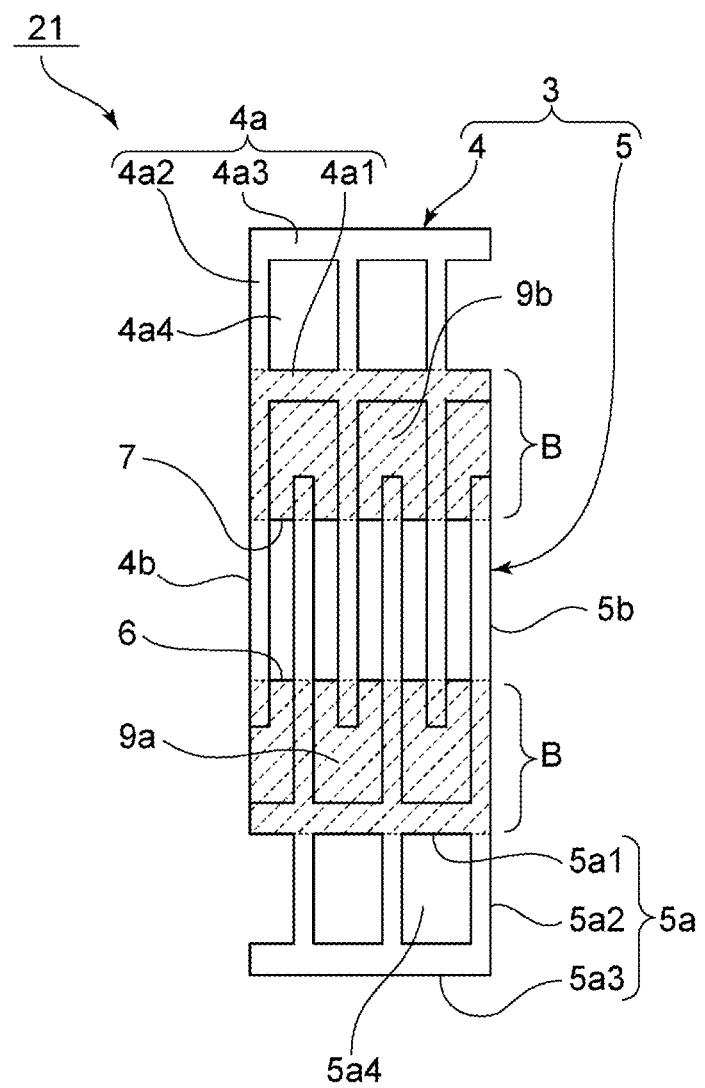
FIG. 6 is a schematic plan view for describing an electrode structure of an acoustic wave device of a second preferred embodiment of the present invention.

FIG. 6 is a schematic plan view for describing an electrode structure of an acoustic wave device according to a second preferred embodiment of the present invention.

In an acoustic wave device 21 of the second preferred embodiment, the structures of the first busbar 4a and the second busbar 5a are different from those of the acoustic wave device 1 according to the first preferred embodiment. The other structures in the acoustic wave device 21 are the same or substantially the same as those of the acoustic wave device 1.

As illustrated in FIG. 6, the first busbar 4a includes an inner busbar 4a1, an intermediate busbar 4a2, and an outer busbar 4a3. In the IDT electrode 3, when the overlap region is defined as the center, a side close to the overlap region is defined as an inner side and a side far from the overlap region is defined as an outer side in the direction of the overlap width.

The base ends of the plurality of first electrode fingers 4b are connected to the inner busbar 4a1. The inner busbar 4a1 and the outer busbar 4a3 are extended in the acoustic wave propagation direction. The intermediate busbar 4a2 includes a plurality of connection portions that connect the inner busbar 4a1 and the outer busbar 4a3 to each other. The region between the connection portions is an opening 4a4.

Similarly, the second busbar 5a includes an inner busbar 5a1, an intermediate busbar 5a2, and an outer busbar 5a3. The region between the respective connection portions of the intermediate busbar 5a2 is an opening 5a4.

The first dielectric film 6 extends from the region between the tip end portions of the plurality of first electrode fingers 4b and the first main surface 2a of the piezoelectric body 2 to the region between the inner busbar 5a1 of the second busbar 5a and the first main surface 2a of the piezoelectric body 2 via the first gap 9a. The size B in the overlap width direction of the first dielectric film 6 is as illustrated in FIG. 6. The second dielectric film 7 is also disposed similarly to the first dielectric film 6.

In the acoustic wave device 21, the acoustic velocity in the region including the intermediate busbar 4a2 and the opening 4a4, and the region including the intermediate busbar 5a2 and the opening 5a4 is higher than the acoustic velocity in the tip end portions of the electrode fingers 4b and 5b. Thus, since the high acoustic velocity region is provided, the deterioration of Q factor is less likely to occur.

Note that the first dielectric film 6 may be disposed at least between the inner busbar 4a1 in the first busbar 4a and the piezoelectric body 2, and the second dielectric film 7 may be disposed at least between the inner busbar 5a1 in the second busbar 5a and the piezoelectric body 2. In other words, the first dielectric film 6 may extend further outward than the inner busbar 5a1 in the overlap width direction, and the second dielectric film 7 may extend further outward than the inner busbar 4a1 in the overlap width direction.

Figure 7:
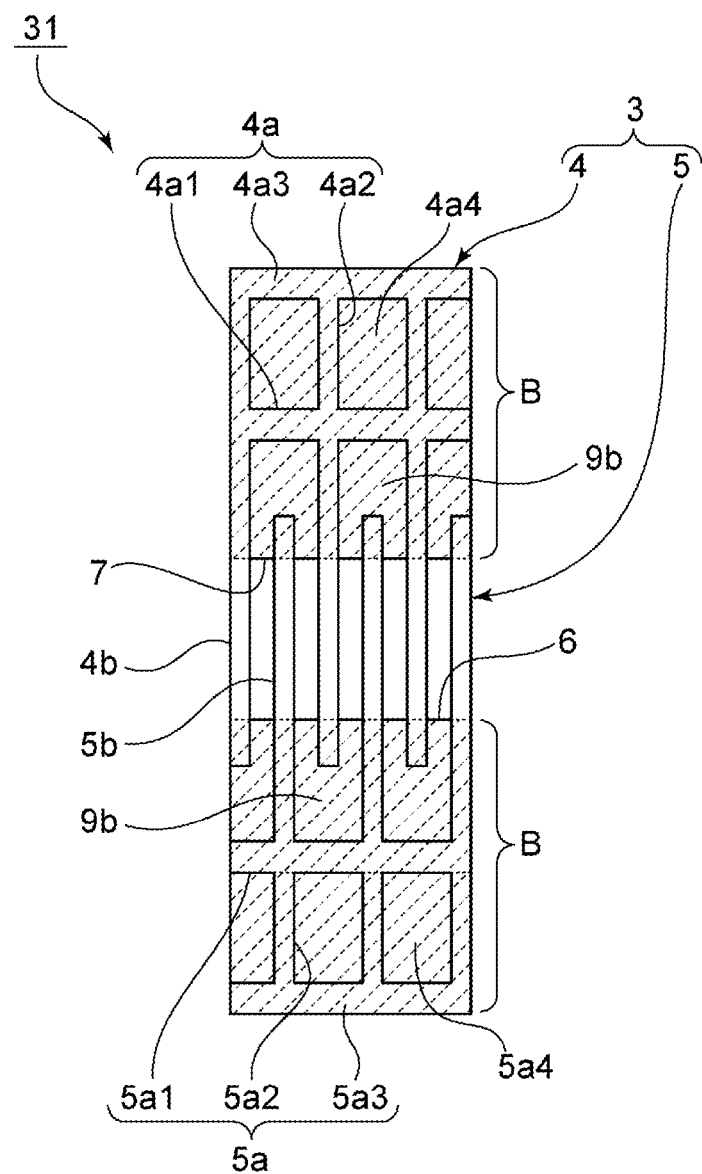
FIG. 7 is a schematic plan view for describing an electrode structure of an acoustic wave device of a third preferred embodiment of the present invention.

For example, in an acoustic wave device 31 of a third preferred embodiment of the present invention illustrated in FIG. 7, the first dielectric film 6 extends from the region between the inner busbar 5a1 and the first main surface 2a of the piezoelectric body 2 to extend to a further outer side portion. The further outer side portion includes the region between the intermediate busbar 5a2 and the first main surface 2a of the piezoelectric body 2, and the region between the outer busbar 5a3 and the first main surface 2a of the piezoelectric body 2. Also, the second dielectric film 7 extends from the region between the inner busbar 4a1 and the first main surface 2a of the piezoelectric body 2 to extend to a further outer side portion. The further outer side portion includes the region between the intermediate busbar 4a2 and the first main surface 2a of the piezoelectric body 2, and the region between the outer busbar 4a3 and the first main surface 2a of the piezoelectric body 2.

Figure 8:
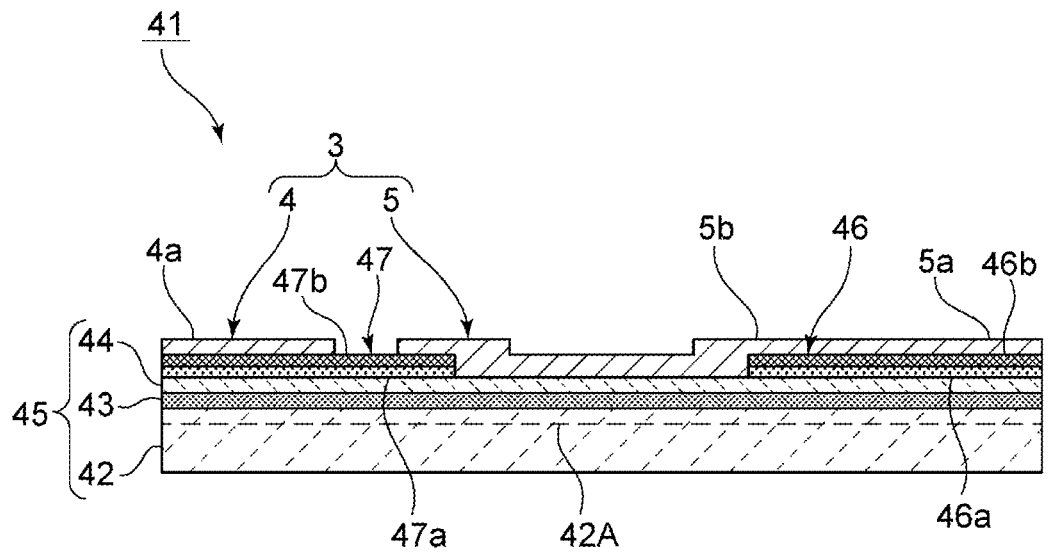
FIG. 8 is a side sectional view of an acoustic wave device according to a fourth preferred embodiment of the present invention.

FIG. 8 is a side sectional view of an acoustic wave device according to a fourth preferred embodiment of the present invention. A first dielectric film 46 and a second dielectric film 47 are each layered on a piezoelectric body 45 in an acoustic wave device 41 illustrated in FIG. 8. The piezoelectric body 45 has a structure in which a low acoustic velocity film 43 and a piezoelectric thin film 44 are layered on a support substrate 42 as a high acoustic velocity member. Here, the high acoustic velocity member refers to a member made of a high acoustic velocity material in which the acoustic velocity of a propagating acoustic wave is higher than the acoustic velocity of an acoustic wave propagating through the piezoelectric thin film 44. The piezoelectric thin film 44 is made of a lithium tantalate film. The piezoelectric body 45 includes the piezoelectric thin film 44 preferably made of a lithium tantalate film, for example. However, because of having the above-described layered structure, the reverse-velocity surface thereof is convex.

The support substrate 42 is a high acoustic velocity support substrate made of a high acoustic velocity material. The low acoustic velocity film 43 is made of a low acoustic velocity material. The acoustic velocity of an acoustic wave propagating through the low acoustic velocity material is lower than the acoustic velocity of an acoustic wave propagating through the piezoelectric thin film 44.

The low acoustic velocity material of the low acoustic velocity film 43 and the high acoustic velocity material of the support substrate 42 as a high acoustic velocity member are not particularly limited as long as the above-described acoustic velocity relationship is satisfied. For example, a dielectric such as silicon oxide or silicon oxynitride, or a synthetic resin, or the like may be used as the low acoustic velocity material. As the high acoustic velocity material, a dielectric, a semiconductor, a metal, or the like may be used, where the dielectric includes, for example, alumina, silicon oxynitride, aluminum nitride, crystal, sapphire, diamond, silicon carbide, silicon, and the like.

Note that, the support substrate 42 is made of a high acoustic velocity material in the acoustic wave device 41. However, a high acoustic velocity film 42A illustrated by the dashed line in FIG. 8 may be layered on the support substrate 42. The high acoustic velocity film 42A is made of a high acoustic velocity material. In this case, the support substrate 42 may be made of a material other than a high acoustic velocity material.

It is preferable that the acoustic velocity of the first dielectric film 46 and the second dielectric film 47 is lower than the acoustic velocity of an acoustic wave propagating through the piezoelectric thin film 44. With this structure, the energy of the acoustic wave may more effectively be confined in the piezoelectric thin film 44.

Further, the first dielectric film 46 and the second dielectric film 47 are made of a layered dielectric film in the acoustic wave device 41. Thus, the first dielectric film 46 and the second dielectric film 47 may each have a structure in which a plurality of dielectric films are layered, and the number of layered films is not particularly limited.

In the present preferred embodiment, for example, piezoelectric-body-side dielectric films 46*a* and 47*a* are preferably made of tantalum pentoxide, and IDT-electrode-side dielectric films 46*b* and 47*b* are preferably made of silicon oxide. In this case, the permittivity of the IDT-electrode-side dielectric films 46*b* and 47*b*, which are close to the IDT electrode 3, is reduced to about 4. Accordingly, the fractional bandwidth may be widened more effectively.

Figure 9:
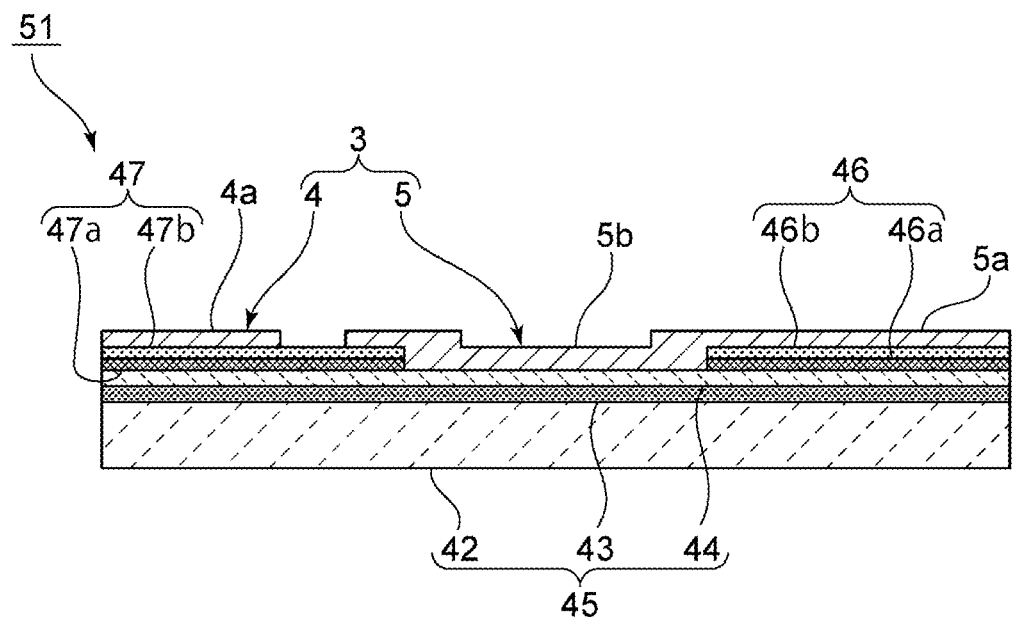
FIG. 9 is a side sectional view of an acoustic wave device according to a fifth preferred embodiment of the present invention.

Alternatively, the piezoelectric-body-side dielectric film 46*a* may be made of silicon oxide, and the IDT-electrode-side dielectric film 46*b* may be made of tantalum pentoxide as in an acoustic wave device 51 of a fifth preferred embodiment illustrated in FIG. 9. The acoustic velocity of tantalum pentoxide is lower than the acoustic velocity of silicon oxide. Accordingly, a dielectric film having a low acoustic velocity is located close to the IDT electrode 3. Thus, the acoustic velocity may effectively be reduced, and the overall thickness of the first dielectric film 46 may be reduced. With this, disconnection is less likely to occur. In addition, when, for example, the configuration of the acoustic wave device 51 is applied to a structure using a piston mode as illustrated in FIG. 6 and FIG. 7, only the thickness of the first and second dielectric films is able to be reduced by reducing the acoustic velocity.

In the case where the above-described layered dielectric film is used, the thickness thereof is not particularly limited, but, for example, the thickness of the piezoelectric-body-side dielectric film 46*a* made of tantalum pentoxide is preferably about 5 nm to about 50 nm, and the thickness of the IDT-electrode-side dielectric film 46*b* made of silicon oxide is also preferably about 5 nm to about 50 nm.

The second dielectric film 47 is configured similarly to the first dielectric film 46, also in the fifth preferred embodiment.

The layered dielectric film is used for the first dielectric film 46 and the second dielectric film 47 in the fourth and fifth preferred embodiments. However, a single layer dielectric film may be used in the fourth and fifth preferred embodiments.

Note that, in the first to the fifth preferred embodiments, the first dielectric film and the second dielectric film have the same or substantially the same configuration, but the first dielectric film and the second dielectric film may have different materials and thicknesses.

Figure 10:
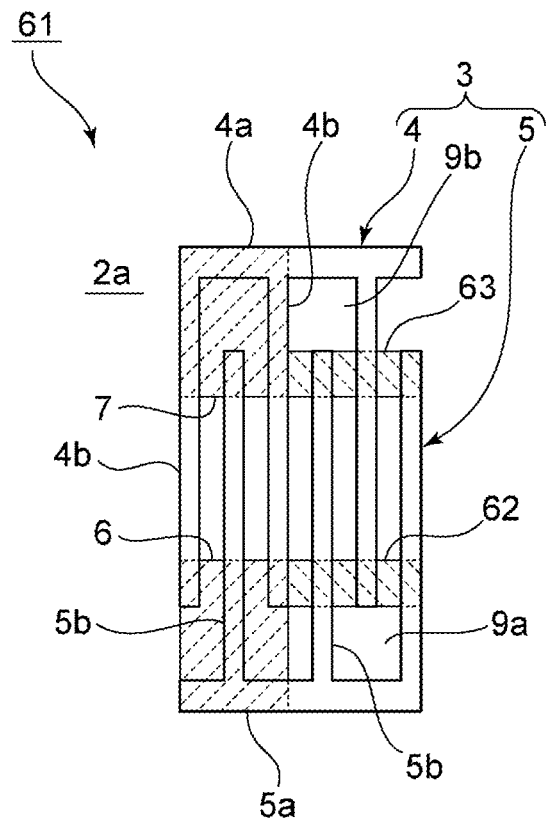
FIG. 10 is a schematic plan view for describing an electrode structure of an acoustic wave device according to a sixth preferred embodiment of the present invention.

FIG. 10 is a schematic plan view for describing an electrode structure of an acoustic wave device 61 according to a sixth preferred embodiment of the present invention. The IDT electrode 3 is configured similarly to the IDT electrode 3 of the acoustic wave device 1 of the first preferred embodiment.

The acoustic wave device 61 differs from the acoustic wave device 1 of the first preferred embodiment as to the region where the first dielectric film 6 and the second dielectric film are disposed. That is, in the acoustic wave propagation direction, the first dielectric film 6 and the second dielectric film 7 do not extend over the entire or substantially the entire length of the first busbar 4*a* and the second busbar 5*a* in the acoustic wave propagation direction. The first dielectric film 6 and the second dielectric film 7 are disposed in the IDT electrode so as to extend from the left end portion to the center or approximate center of the IDT electrode 3 in the acoustic wave propagation direction in FIG. 10. Third dielectric films 62 and that do not extend to the first gap 9*a* and second gap 9*b* respectively are disposed in the region from the center or approximate center of the IDT electrode 3 in the acoustic wave propagation direction to the right end portion of the IDT electrode 3. The third dielectric films 62 and 63 are disposed in a region extending from the tip end of the first electrode finger 4*b* or the tip end of the second electrode finger 5*b* toward the center of the overlap width. Thus, a low acoustic velocity region is provided.

In the acoustic wave device 61, the first dielectric film 6 and the second dielectric film 7 are disposed in a partial region of the IDT electrode 3 in the acoustic wave propagation direction. In the remaining region excluding the partial region in which the first dielectric film 6 and the second dielectric film 7 are disposed, the first dielectric film 6 and the second dielectric film 7 are not disposed in the portion where the first busbar 4*a* and the second electrode finger 5*b* face each other, or the second busbar 5*a* and the first electrode finger 4*b* face each other. Accordingly, the fractional bandwidth is considered to be narrow compared with that in the acoustic wave device 1 of the first preferred embodiment. However, the fractional bandwidth may be widened compared with the acoustic wave device according to the related art including neither first dielectric film 6 nor second dielectric film 7. Thus, in preferred embodiments of the present invention, the first dielectric film 6 and the second dielectric film 7 do not need to extend in the entire or substantially the entire length of the IDT electrode 3 in the acoustic wave propagation direction. Further, the width of the fractional bandwidth may be adjusted by controlling the size of the region in which the first dielectric film 6 and the second dielectric film 7 are disposed.

Figure 11:
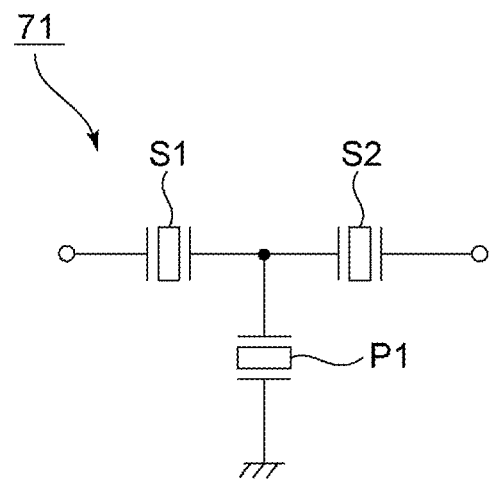
FIG. 11 is a circuit diagram of a ladder filter according to a seventh preferred embodiment of the present invention.

FIG. 11 is a circuit diagram for describing a ladder filter according to a seventh preferred embodiment of the present invention. A ladder filter 71 includes a plurality of series arm resonators S1 and S2, and a parallel arm resonator P1. Noted that a plurality of parallel arm resonators P1 may be provided. Further, the number of stages of the ladder filter is not particularly limited.

In the ladder filter 71, each of the series arm resonators S1 and S2 and the parallel arm resonator P1 is defined by an acoustic wave resonator. The parallel arm resonator P1 is defined by the acoustic wave device 1 of the first preferred embodiment. Further, the series arm resonator S1 is defined by the acoustic wave device 61 of the sixth preferred embodiment. The series arm resonator S2 is defined by an acoustic wave device having the electrode structure illustrated in FIG. 12 and FIG. 13.

Figure 12:
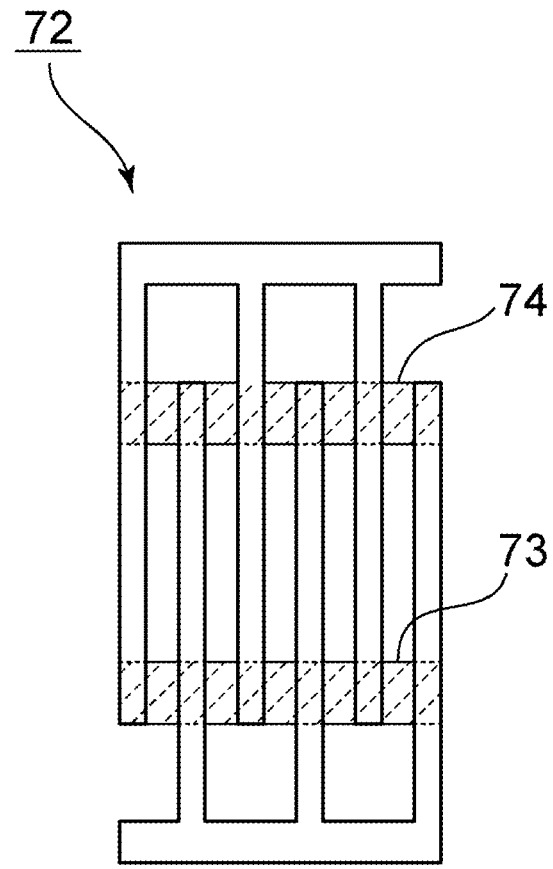
FIG. 12 is a schematic plan view for describing an electrode structure of a series arm resonator of the ladder filter in FIG. 11.
Figure 13:
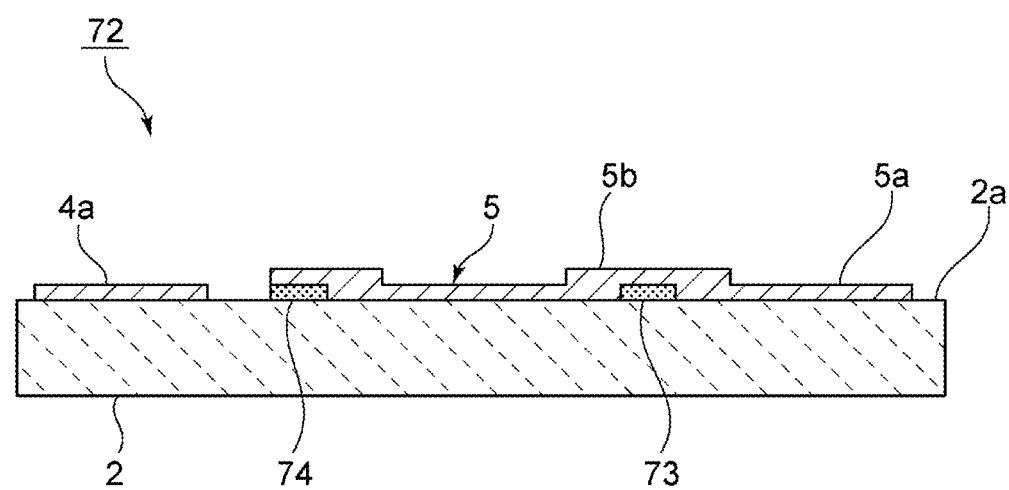
FIG. 13 is a side sectional view of an acoustic wave device with the electrode structure illustrated in FIG. 12.

An acoustic wave device 72 illustrated in FIG. 12 and FIG. 13 includes dielectric films 73 and 74. In the acoustic wave device 72, the overlap region includes the central region and the low acoustic velocity regions disposed outside the central region in the overlap width direction. The dielectric films 73 and 74 are disposed at the tip end portions of the low acoustic velocity region. The low acoustic velocity region is provided by disposing the dielectric film 73 between the first electrode finger 4*b* and the first main surface 2*a* of the piezoelectric body 2 and disposing the dielectric film 74 between the second electrode finger 5*b* and the first main surface 2*a* of the piezoelectric body 2. Note that the dielectric films 73 may be layered on the plurality of first electrode fingers 4*b*, and the dielectric film 74 may be layered on the plurality of second electrode fingers 5*b*.

In the ladder filter according to the present preferred embodiment, an acoustic wave device according to any of the preferred embodiments of the present invention may be used as the series arm resonator S1 or the parallel arm resonator P1. In this case, the fractional bandwidth may be easily adjusted by controlling the size of the region in which the first and second dielectric films are disposed in the series arm resonator S1 and the parallel arm resonator P1. Further, an acoustic wave device other than acoustic wave devices according to preferred embodiments of the present invention may be combined with the acoustic wave devices according to preferred embodiments of the of the present invention. For example, as in the present preferred embodiment, the acoustic wave device 72 is used as the series arm resonator S2. Thus, the pass band of the ladder filter 71 may easily be adjusted.

Preferably, as in the present preferred embodiment, the parallel arm resonator is defined by an acoustic wave device according to a preferred embodiment of the present invention. A large fractional bandwidth is required in the parallel arm resonator of a ladder filter. A small fractional bandwidth, on the other hand, is preferable in the series arm resonator in order to improve the steepness of the filter characteristics. Accordingly, in the ladder filter 71, it is preferable to use an acoustic wave device according to a preferred embodiment of the present invention for the parallel arm resonator P1. As a series arm resonator, it is preferable to use an acoustic wave device in which first and second dielectric films are not provided between first and second busbars and a piezoelectric body, and between tip end portions of first and second electrode fingers and the piezoelectric body. As the series arm resonator, however, an acoustic wave device according to a preferred embodiment of the present invention in which the first and second dielectric films are partially provided may be used.

That is, at least two resonators among the plurality of resonators are acoustic wave devices configured according to a preferred embodiment of the present invention, and the regions in which the first and second dielectric films are disposed along the acoustic wave propagation direction are preferably different from each other in the at least two acoustic wave devices above. Thus, ladder filters having various filter characteristics may be achieved.

Figure 14:
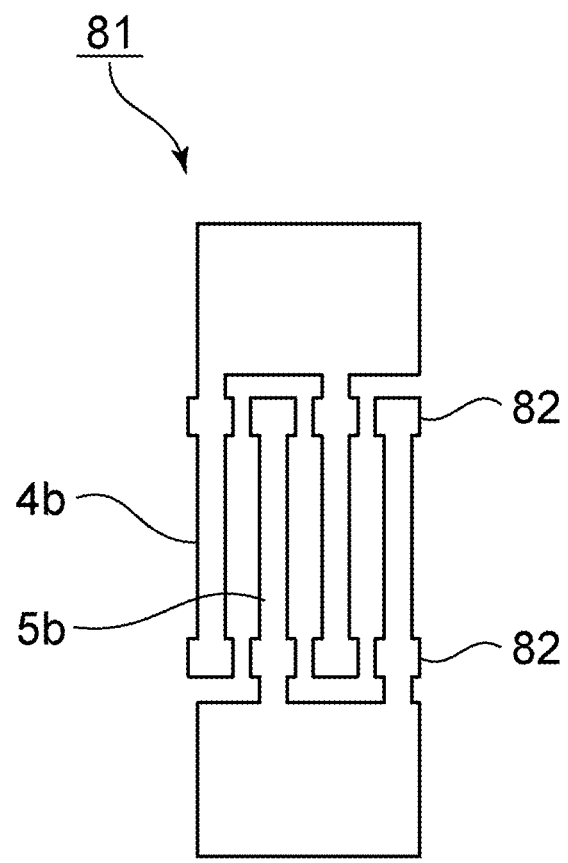
FIG. 14 is a plan view for describing a modification of an IDT electrode of a series arm resonator.

In the ladder filter 71, an acoustic wave device 81 illustrated in FIG. 14 may be used as the series arm resonator. In the acoustic wave device 81, the overlap region includes a central portion and first and second low acoustic velocity regions disposed outside the central portion. In the first and second low acoustic velocity regions, the width of the first electrode finger 4b and the second electrode finger 5b, which is a dimension along the acoustic wave propagation direction, is larger than the dimension of the central portion along the acoustic wave propagation direction. Thus, the low acoustic velocity region is provided. That is, it is not limited to a configuration in which a low acoustic velocity region is provided by using the dielectric films 73 and 74 as in the acoustic wave device 72, and a low acoustic velocity region may be provided by including a large-width portion 82.

Figure 15:
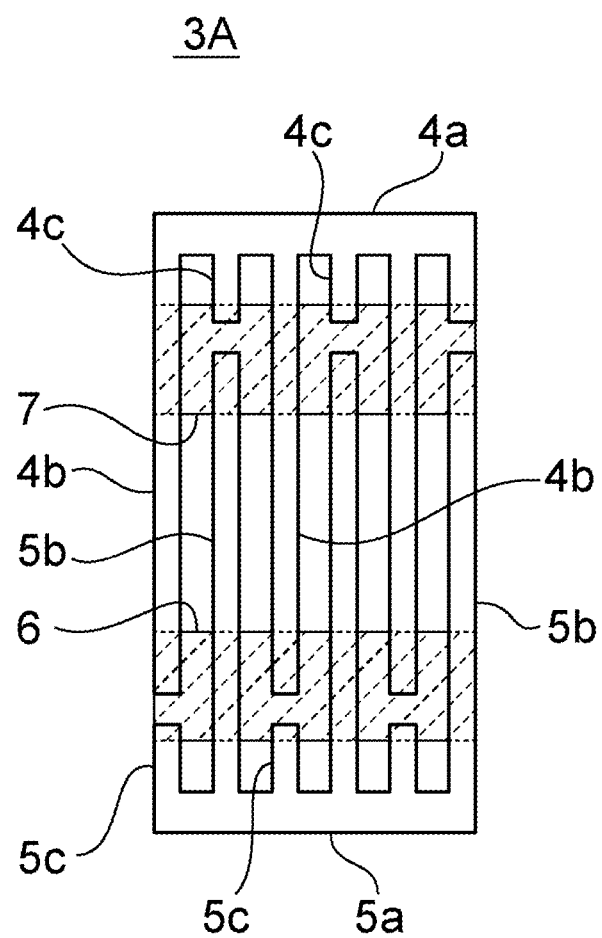
FIG. 15 is a schematic plan view for describing an electrode structure of an acoustic wave device according to an eighth preferred embodiment of the present invention.

FIG. 15 is a schematic plan view for describing an electrode structure of an acoustic wave device according to an eighth preferred embodiment of the present invention.

In the acoustic wave device of the eighth preferred embodiment, a first IDT electrode 3A includes offset electrode fingers 4c and 5c. The base end of the offset electrode finger 4c is connected to the first busbar 4a, and the offset electrode finger 4c extends toward the second electrode finger 5b. The tip end of the offset electrode finger 4c faces the second electrode finger 5b with a gap therebetween. The base end of the offset electrode finger 5c is connected to the second busbar 5a, and the tip end thereof extends toward the first electrode finger 4b. The tip end of the offset electrode finger 5c faces the tip end of the first electrode finger 4b with a gap therebetween. As described above, the IDT electrode 3A may include the offset electrode fingers 4c and 5c in an acoustic wave device according to a preferred embodiment of the present invention. In this case, it is sufficient that the first dielectric film 6 may not extend to the second busbar 5a, but may extend to the tip end portion of the offset electrode finger 5c, and the second dielectric film 7 may not extend to the first busbar 4a, but may extend to the tip end portion of the offset electrode finger 4c. Further, the first dielectric film 6 and the second dielectric film 7 do not need to be extended to the entire or substantially the entire region under the offset electrode fingers 4c and 5c (the region extending from the tip end to the base end of each of the offset electrode fingers 4c and 5c). Note that such an offset electrode finger is also a portion of the busbar.

Figure 16:
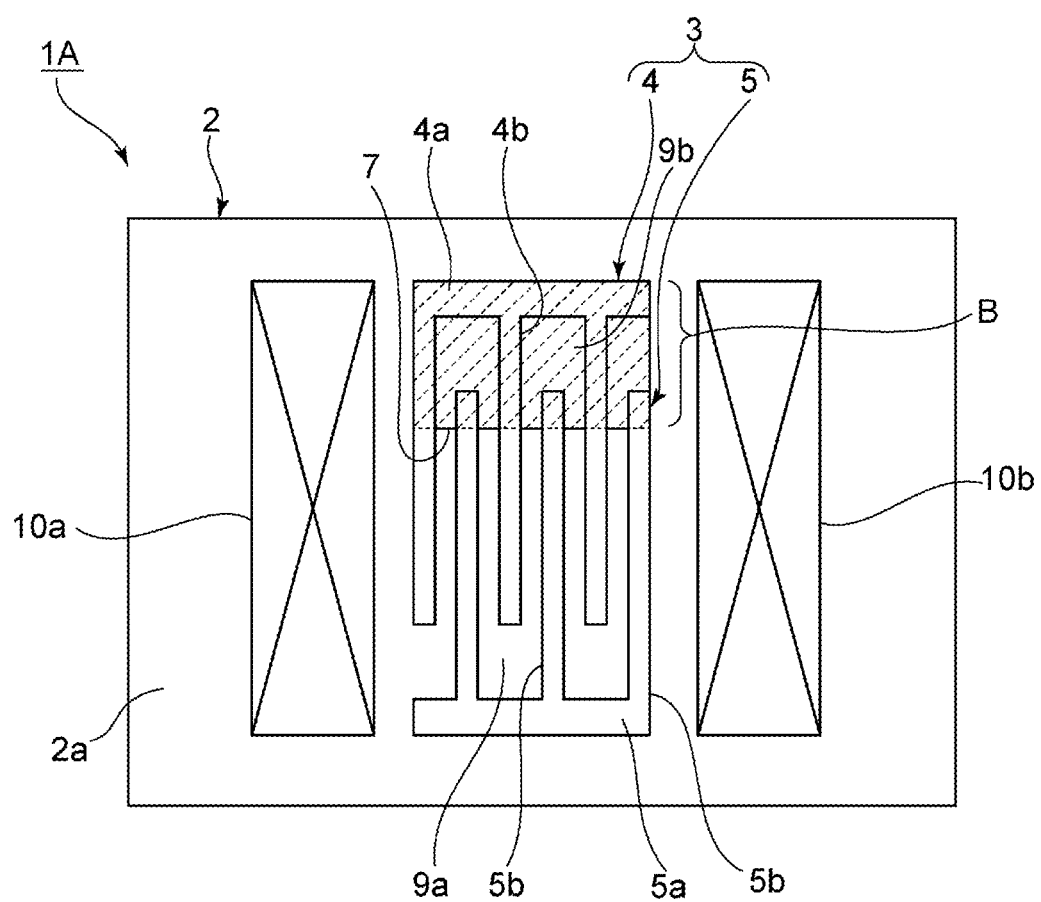
FIG. 16 is a schematic plan view of an acoustic wave device according to a ninth preferred embodiment of the present invention.

FIG. 16 is a schematic plan view of an acoustic wave device according to a ninth preferred embodiment of the present invention. An acoustic wave device 1A of the ninth preferred embodiment is the same or substantially the same as the acoustic wave device 1 in FIG. 2, except that the first dielectric film 6 is not provided. In this way, only one of the first dielectric film 6 and the second dielectric film 7 may be provided.

Although each of the acoustic wave devices of the first to ninth preferred embodiments above has been described as an acoustic wave resonator, the present invention can also be applied to a resonator acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric body; and
an IDT electrode on the piezoelectric body; wherein
the IDT electrode includes a first busbar, a second busbar being separate from the first busbar, a plurality of first electrode fingers each of which includes a base end and a tip end, and a plurality of second electrode fingers each of which includes a base end and a tip end, the plurality of first electrode fingers and the plurality of second electrode fingers are interdigitated with each other, the base ends of the first electrode fingers are connected to the first busbar, the tip ends of the first electrode fingers face the second busbar with a first gap therebetween, the base ends of the second electrode fingers are connected to the second busbar, and the tip ends of the second electrode fingers face the first busbar with a second gap therebetween;
a first dielectric film extends from a region between tip end portions of the first electrode fingers and the piezoelectric body to a region between the second busbar and the piezoelectric body via the first gap;
the second electrode fingers are in direct contact with the piezoelectric body at a center or approximate center of an overlap width; and
a permittivity of the first dielectric film is lower than a permittivity of the piezoelectric body.

2. The acoustic wave device according to claim 1, wherein each of the first busbar and the second busbar includes an inner busbar connected to the first electrode fingers or the second electrode fingers, and an outer busbar located outside the inner busbar in an overlap width direction, and a region including an intermediate busbar connecting the inner busbar and the outer busbar; and an acoustic velocity in the region including the intermediate busbar is higher than an acoustic velocity in the tip end portions of the first electrode fingers and in the tip end portions of the second electrode fingers.

3. The acoustic wave device according to claim 2, wherein the first dielectric film extends to at least a region between the inner busbar and the piezoelectric body.

4. The acoustic wave device according to claim 3, wherein the piezoelectric body includes a high acoustic velocity member, a piezoelectric thin film, and a low acoustic velocity film layered between the high acoustic velocity member and the piezoelectric thin film; and an acoustic wave velocity of an acoustic wave propagating through the high acoustic velocity member is higher than an acoustic velocity of an acoustic wave propagating through the piezoelectric thin film, and an acoustic velocity of an acoustic wave propagating through the low acoustic velocity film is lower than the acoustic velocity of the acoustic wave propagating through the piezoelectric thin film.

5. The acoustic wave device according to claim 3, wherein a reverse-velocity surface of the piezoelectric body is convex; and an acoustic velocity in the first dielectric film is lower than an acoustic velocity of the acoustic wave propagating through the piezoelectric body.

6. The acoustic wave device according to claim 2, wherein the piezoelectric body includes a high acoustic velocity member, a piezoelectric thin film, and a low acoustic velocity film layered between the high acoustic velocity member and the piezoelectric thin film; and an acoustic wave velocity of an acoustic wave propagating through the high acoustic velocity member is higher than an acoustic velocity of an acoustic wave propagating through the piezoelectric thin film, and an acoustic velocity of an acoustic wave propagating through the low acoustic velocity film is lower than the acoustic velocity of the acoustic wave propagating through the piezoelectric thin film.

7. The acoustic wave device according to claim 2, wherein a reverse-velocity surface of the piezoelectric body is convex; and an acoustic velocity in the first dielectric film is lower than an acoustic velocity of the acoustic wave propagating through the piezoelectric body.

8. The acoustic wave device according to claim 1, wherein the piezoelectric body is a lithium tantalate film or a lithium niobate film; and an acoustic velocity in the first dielectric film is lower than an acoustic velocity of the acoustic wave propagating through the piezoelectric body.

9. The acoustic wave device according to claim 1, wherein the first dielectric film is a layered dielectric film including a plurality of dielectric films that are layered.

10. The acoustic wave device according to claim 9, wherein the layered dielectric film includes a piezoelectric-body-side dielectric film and an IDT-electrode-side dielectric film closer to the IDT electrode than the piezoelectric-body-side dielectric film.

11. The acoustic wave device according to claim 10, wherein an acoustic velocity of the piezoelectric-body-side dielectric film is higher than an acoustic velocity of the IDT-electrode-side dielectric film.

12. The acoustic wave device according to claim 10, wherein a permittivity of the piezoelectric-body-side dielectric film is lower than the permittivity of the piezoelectric body, and is higher than a permittivity of the IDT-electrode-side dielectric film.

13. The acoustic wave device according to claim 1, wherein the first dielectric film is disposed in a partial region of the second busbar of the IDT electrode along an acoustic wave propagation direction.

14. The acoustic wave device according to claim 13, wherein the first dielectric film is not disposed in a portion where the first busbar and the second electrode fingers face each other in a remaining region excluding the partial region.

15. A ladder filter comprising:
a resonator defined by the acoustic wave device of claim 1.

16. The acoustic wave device according to claim 1, further comprising:

a second dielectric film extending from a region between tip end portions of the second electrode fingers and the piezoelectric body to a region between the first busbar and the piezoelectric body via the second gap; wherein the first electrode fingers are in direct contact with the piezoelectric body at the center or the approximate center of the overlap width; and a permittivity of the second dielectric film is lower than the permittivity of the piezoelectric body.

17. The acoustic wave device according to claim 16, wherein the piezoelectric body includes a high acoustic velocity member, a piezoelectric thin film, and a low acoustic velocity film layered between the high acoustic velocity member and the piezoelectric thin film; and an acoustic wave velocity of an acoustic wave propagating through the high acoustic velocity member is higher than an acoustic velocity of an acoustic wave propagating through the piezoelectric thin film, and an acoustic velocity of an acoustic wave propagating through the low acoustic velocity film is lower than the acoustic velocity of the acoustic wave propagating through the piezoelectric thin film.

18. The acoustic wave device according to claim 1, wherein the piezoelectric body includes a high acoustic velocity member, a piezoelectric thin film, and a low acoustic velocity film layered between the high acoustic velocity member and the piezoelectric thin film; and an acoustic wave velocity of an acoustic wave propagating through the high acoustic velocity member is higher than an acoustic velocity of an acoustic wave propagating through the piezoelectric thin film, and an acoustic velocity of an acoustic wave propagating through the low acoustic velocity film is lower than the acoustic velocity of the acoustic wave propagating through the piezoelectric thin film.

19. The acoustic wave device according to claim 18, wherein the high acoustic velocity member includes a support substrate and a high acoustic velocity film disposed on the support substrate; and the acoustic velocity of the acoustic wave propagating through the high acoustic velocity film is higher than the acoustic velocity of the acoustic wave propagating through the piezoelectric thin film.

20. The acoustic wave device according to claim 18, wherein the high acoustic velocity member includes a high acoustic velocity support substrate.

\* \* \* \* \*